United States Patent [19]

Daniel et al.

[11] 4,400,669

[45] Aug. 23, 1983

[54] MAGNETOSTATIC WAVE DELAY LINE HAVING IMPROVED GROUP DELAY LINEARITY

[75] Inventors: Michael R. Daniel, Monroeville; John D. Adam, Murrysville, both of Pa.; Robert A. Moore, Arnold, Md.

[73] Assignee: The United States of America as represented by the Secretary of the Air Force, Washington, D.C.

[21] Appl. No.: 305,667

[22] Filed: Sep. 25, 1981

[51] Int. Cl.³ .................. H03H 9/30; H03H 9/125
[52] U.S. Cl. ................................ 333/141; 333/145; 333/147
[58] Field of Search ............ 333/141, 142, 147, 148, 333/150–155, 193–196, 145; 310/26, 313 R, 313 A, 313 B, 313 C, 313 D; 331/107 A

[56] References Cited

U.S. PATENT DOCUMENTS

| | | | |
|---|---|---|---|
| 3,244,993 | 4/1966 | Schloemann | 333/148 |
| 3,353,118 | 11/1967 | Olson et al. | 332/144 |
| 3,366,896 | 1/1968 | Skudera, Jr. et al. | 333/147 |
| 3,530,409 | 9/1970 | Vasile | 333/147 |
| 3,593,215 | 7/1971 | Moore | 333/147 |
| 3,670,271 | 6/1972 | Vasile | 333/141 |
| 3,793,598 | 2/1974 | Hofelt et al. | 333/144 |
| 3,864,647 | 2/1975 | Bongianni | 333/141 |
| 3,895,324 | 7/1975 | Morgenthaler | 333/147 |
| 3,935,550 | 1/1976 | Adam et al. | 333/148 |
| 4,199,737 | 4/1980 | Patterson et al. | 333/154 |

*Primary Examiner*—Marvin L. Nussbaum
*Attorney, Agent, or Firm*—Donald J. Singer; Willard R. Matthews

[57] ABSTRACT

The linearity of group delay versus frequency in magnetostatic wave delay lines is improved by a linear variation of one of three discrete parameters in the region between the two delay line transducers. The parameter variation is applied to magnetostatic wave delay lines that have a ground plane, a magnetic garnet crystal film substrate that is spaced from the ground plane and has transmitting and receiving transducers engaged to it, and a magnetic bias field. The discrete parameters varied are the magnetic bias field; the distance of the substrate from the ground plane; and the thickness of the substrate. Appropriate linear variations of any one of the these parameters provides improved linearity of group delay versus frequency.

8 Claims, 9 Drawing Figures

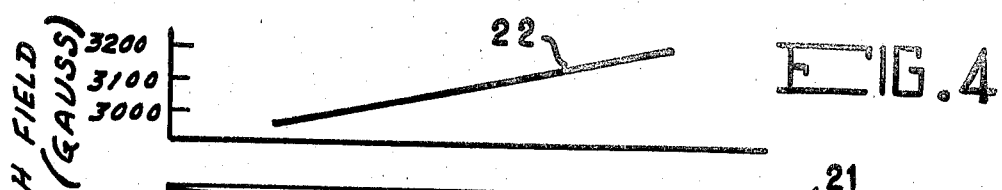
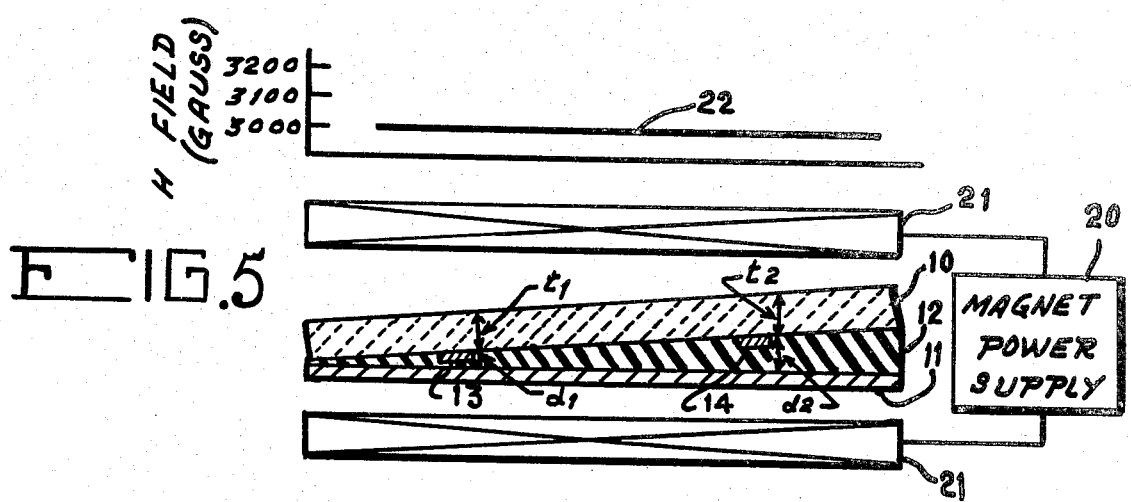
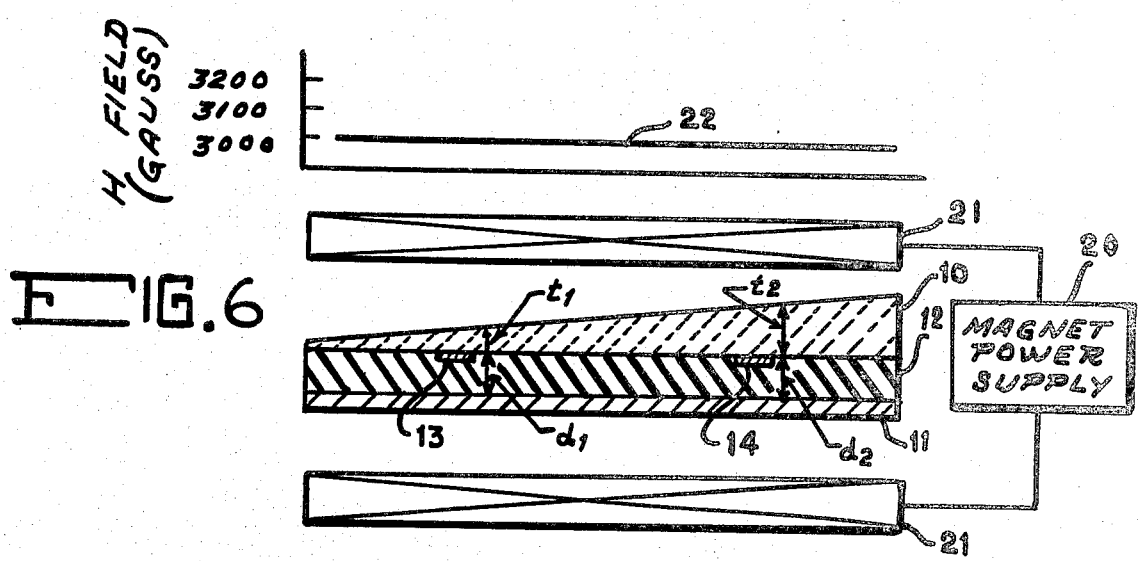

MAGNETOSTATIC WAVE DELAY LINE HAVING IMPROVED GROUP DELAY LINEARITY

STATEMENT OF GOVERNMENT INTEREST

The invention described herein may be manufactured and used by or for the Government for governmental purposes without the payment of any royalty thereon.

BACKGROUND OF THE INVENTION

The present invention relates to magnetostatic wave delay lines and in particular to means for improving the linearity of group delay versus frequency in such devices. Magnetostatic waves are periodic disturbances of the magnetization which can propagate, for example, in a film of a magnetic garnet crystal such as Yttrium Iron Garnet (YIG). They are the magnetic analog of acoustic waves in crystals. As such they offer the potential for device application as delay lines in the processing of radar signals at microwave frequencies with the additional advantage of lower insertion loss over their acoustic counterparts. In particular their inherently dispersive behavior offers the potential for pulse compression filtering in ECM applications at L- and S-bands such as the microscan receiver. They would also operate at least up to X-band. The group delay versus frequency characteristic for these waves have been made approximately linear over a certain frequency range by placing the YIG film an appropriate distance from an electrical ground plane. Further improvement, however, in linearity of group delay is desirable for many applications. It is also an object in magnetostatic delay line design to achieve group delay linearity over an extended frequency range. These requirements cannot be met fully by state-of-the-art techniques. Accordingly, there currently exists the need for magnetostatic delay lines having improved group delay linearity versus frequency over extended frequency ranges. The present invention is directed toward satisfying that need.

SUMMARY OF THE INVENTION

The invention is a magnetostatic wave delay line having improved group delay versus frequency characteristics. The delay line is structured as a ground plane member with a magnetic garnet film substrate in spaced adjacent relationship to it. Input and output transducers are operatively connected to the magnetic garnet film substrate. A magnetic bias field traverses the delay line normal to the magnetic garnet film substrate. One of three discrete parameters are linearly varied in the region between the input and output transducers. In a first embodiment of the invention the magnetic bias field strength is varied; in a second embodiment the distance between the magnetic garnet film substrate and the ground plane member is varied; and, in a third embodiment the thickness of the magnetic garnet film substrate is varied.

It is a principal object of the invention to provide a new and improved magnetostatic wave delay line.

It is another object of the invention to provide a magnetostatic wave delay line having improved group delay linearity versus frequency characteristics.

It is another object of the invention to provide a magnetostatic wave delay line having improved group delay linearity versus frequency over an extended frequency range.

These together with other objects, features and advantages of the invention will become more readily apparent from the following detailed description taken in conjunction with the illustrative embodiments in the accompanying drawings wherein like elements are given like reference numerals throughout.

DESCRIPTION OF THE DRAWINGS

FIG. 4 is a sectional view of a magnetostatic wave delay line incorporating a first embodiment of the invention;

FIG. 5 is a sectional view of a magnetistatic wave delay line incorporating a second embodiment of the invention;

FIG. 6 is a sectional view of a magnetostatic wave delay line incorporating a third embodiment of the invention;

DESCRIPTION OF THE PREFERRED EMBODIMENT

Magnetostatic waves offer the potential for lower-insertion-loss delay lines than their acoustic counterparts at microwave frequencies. The group delay versus frequency can be made quasi linear by a suitable arrangement of the supporting magnetic film and an electrical ground plane. This has been done and represents the current state of the art. The invention relates to the further improvement of the quasi linearity of the delay by allowing one of three parameters to have a linear variation between the magnetostatic wave transmitter and receiver transducers. These parameters are: the magnetic bias field; the distance of the magnetic film from the ground plane; and the thickness of the magnetic film.

Figure 1:
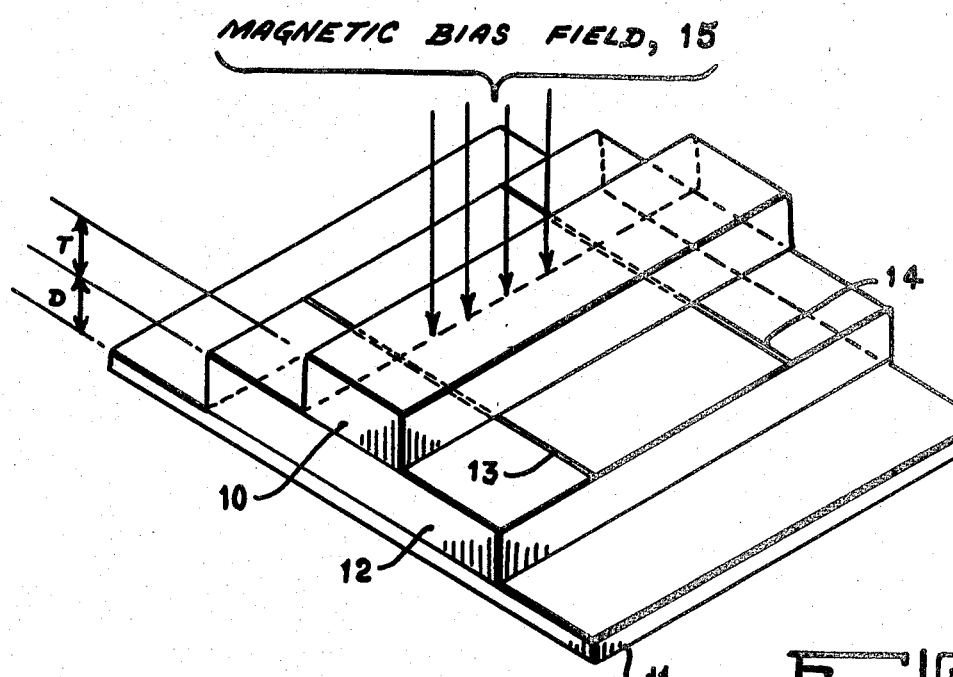
FIG. 1 is an isometric illustration of a magnetostatic wave delay line of the type to which the invention pertains.

The type of magnetostatic wave delay line to which the invention applies is illustrated by FIG. 1. It comprises magnetic garnet crystal film substrate 10, conductive sheet ground plane 11, dielectric spacer 12, transmitting (input) transducer 13, receiving (output) transducer 14 and a magnetic bias field shown by arrows 15. Substrate 10 can be fabricated of Yttrium Iron Garnet. The magnetic bias field is provided by magnets (not shown) and the direction of the magnetic field determines the type of magnetostatic waves that propagate through the delay line. In the present illustration the type of waves are forward volume waves, although the invention is not limited thereto.

Figure 2:
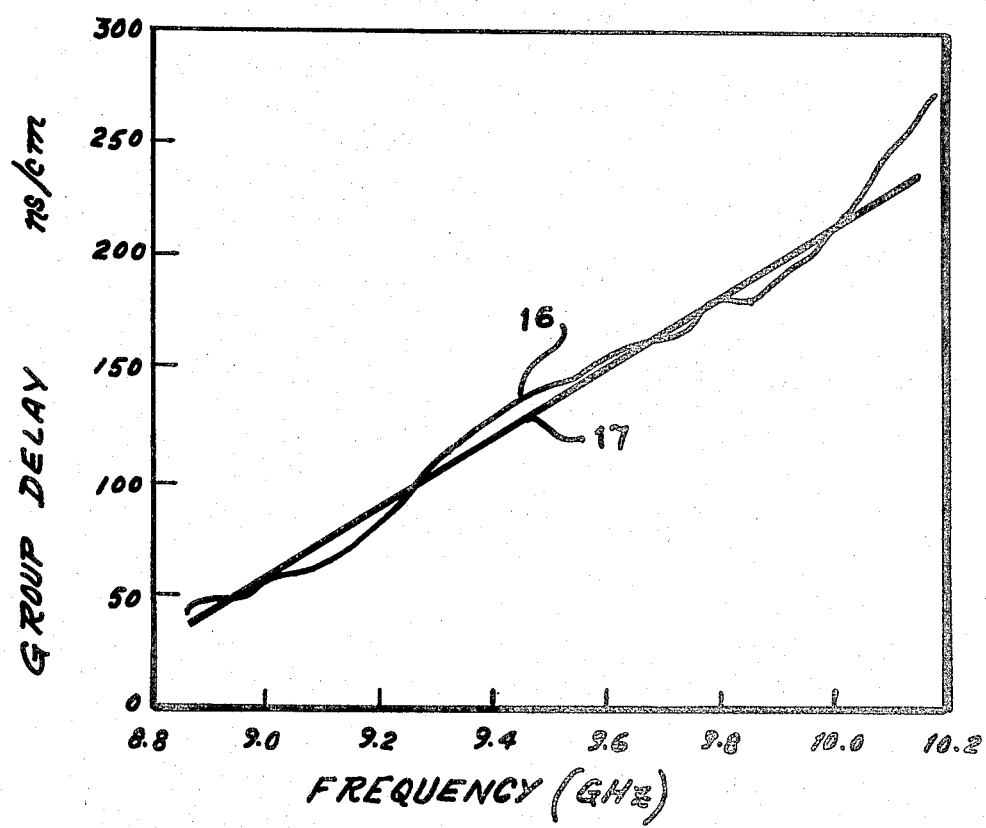
FIG. 2 is a graph showing group delay versus frequency for the delay line illustrated in FIG. 1.
Figure 3:
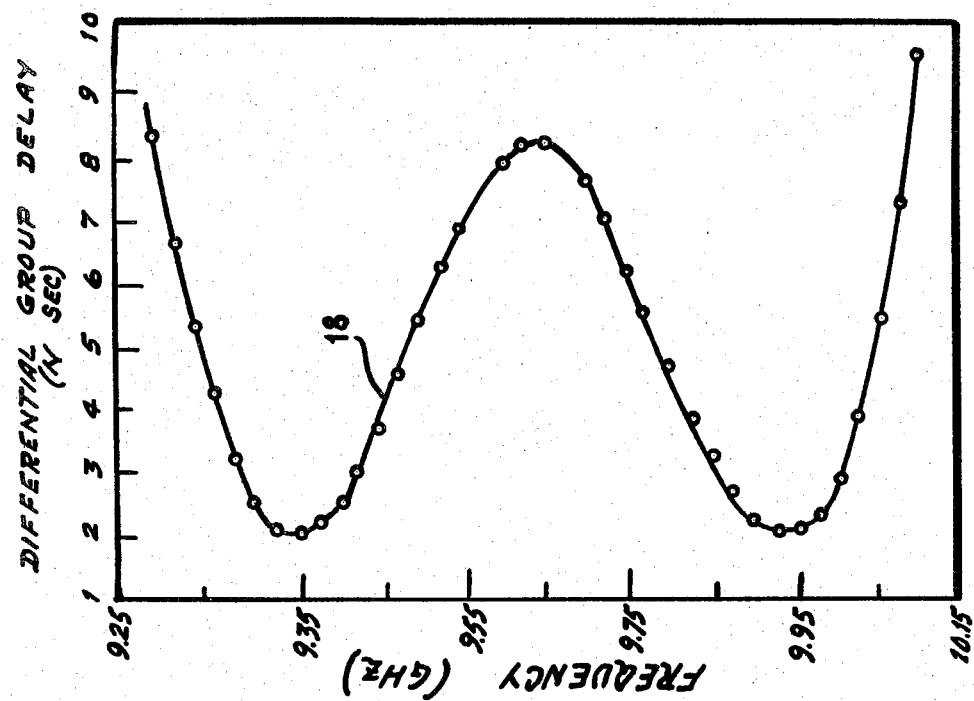
FIG. 3 is a graph showing deviation of the delay with the fixed and unadjusted parameters of FIG. 1.

Referring to FIGS. 2 and 3 there is illustrated the group delay versus frequency characteristics of a delay line as shown in FIG. 1 wherein, by way of example, the thickness T of substrate 10 to 20 microns, the distance D of the substrate 10 from ground plane member 11 is 20 microns and the magnetic bias field is uniformly 3000 gauss. Curve 16 illustrates the results of experimental data and is the measured absolute delay for these parameters. This curve 16 is compared to the desired linear group delay characteristic 17. Curve 18 of FIG. 3 shows the deviation from linearity of the delay with the fixed and unadjusted parameters given.

By adjusting one of the parameters given or any combination thereof the elongated W-shaped variation of the delay (curve 16 of FIG. 2) from the straight line (curve 17 of FIG. 2) may be smoothed out over a useful frequency range. FIGS. 4, 5 and 6 illustrate the three embodiments of the invention that implement this technique.

Figure 7:
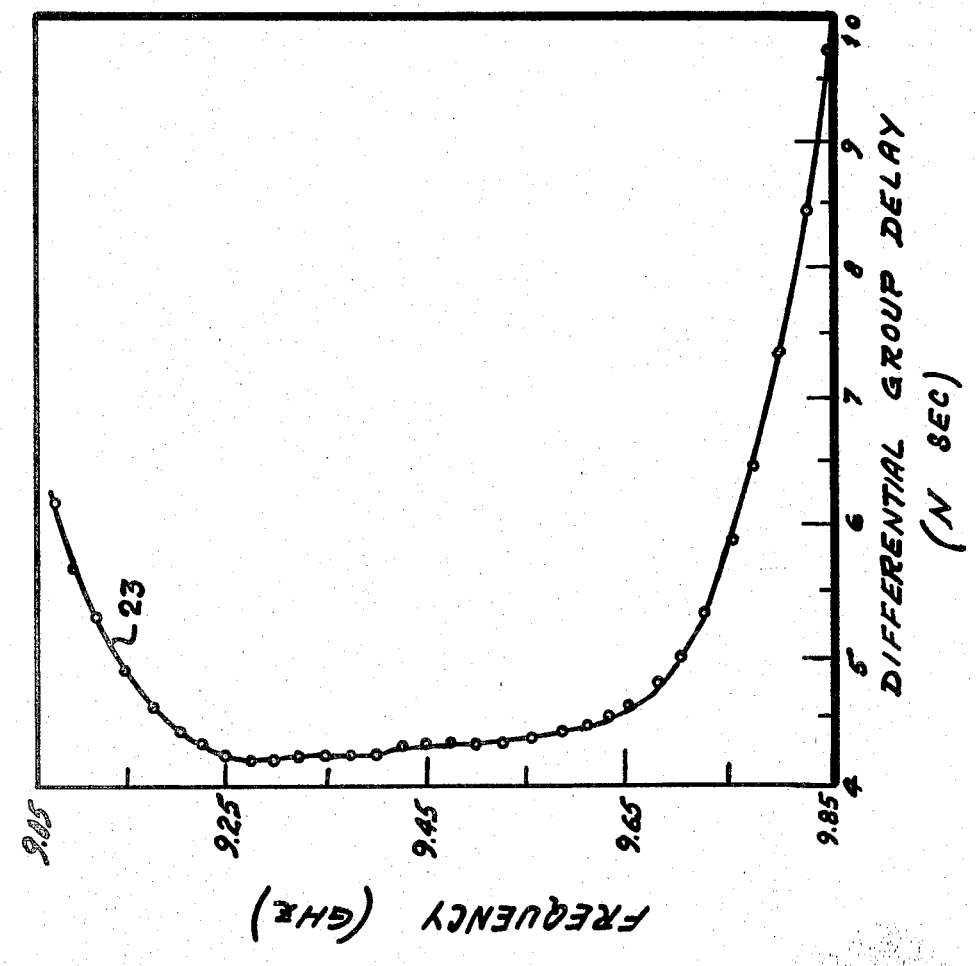
FIG. 7 is a graph showing the improvement in delay linearity resulting from implementation of the embodiment of FIG. 4.

The embodiment of the invention that utilizes linear variation of the magnetic bais field is illustrated by FIG. 4. In this embodiment the thickness T of the substrate 10 is uniform and, in the example given, also $t_1=t_2=20$ microns. The spacing D between the substrate 10 and the ground plane member 11 is also uniform and $d_1=d_2=20$ microns. The magnetic bias field generated by magnets 21 and magnetic power supply 20 uniformly varies between input transducer 13 and output transducer 14 from 3000 gauss to 3200 gauss as shown by curve 22 of the graph shown above the illustrated delay line. Curve 23 of FIG. 7 shows the improvement in linearity (as compared to curve 18 of FIG. 3) resulting from implementation of this embodiment.

Figure 8:
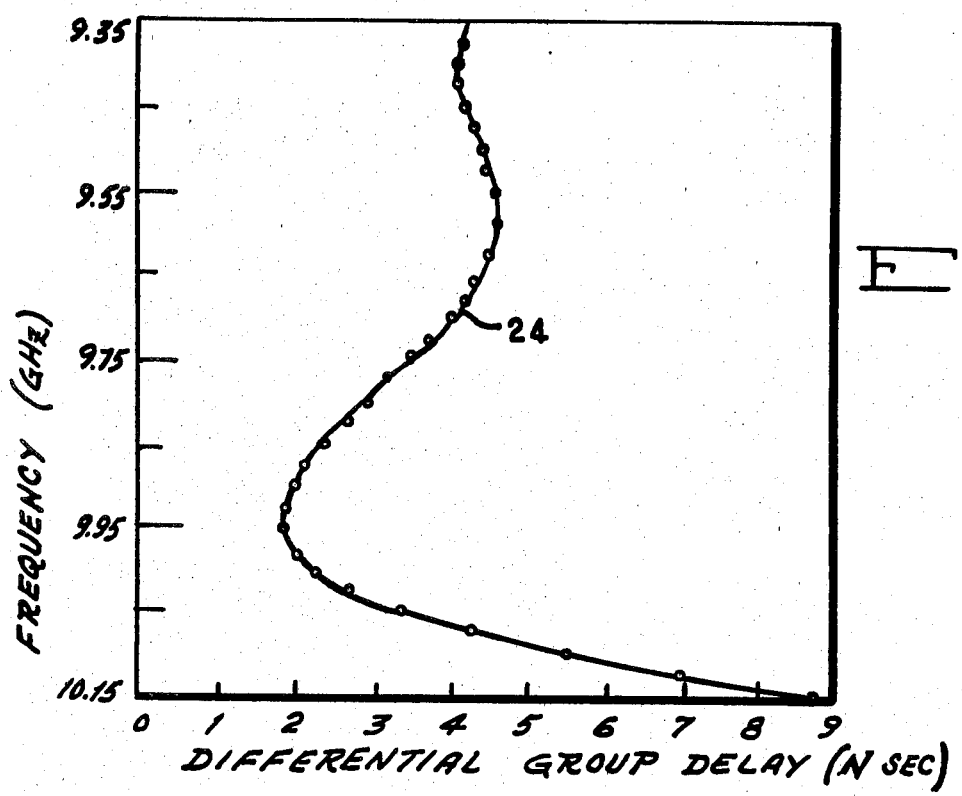
FIG. 8 is a graph showing the improvement in delay linearity resulting from implementation of the embodiment of FIG. 5.

FIG. 5 shows the embodiment of the invention that utilizes linear variation of the distance of the substrate 30 from the ground plane member. In this embodiment the magnetic bias field is a uniform 3000 gauss between the input and output transducers as shown by the graph above FIG. 5 and the thickness T of the substrate 10 is again uniform and $t_1=t_2=20$ microns. The distance between the substrate 10 and the ground plane member 11 is varied uniformly between the input and output transducers and $d_1<d_2$. In the example given $d_1=10$ microns and $d_2=30$ microns. This embodiment can be realized by merely appropriately tapering dielectric spacer 12. Curve 24 of FIG. 8 shows the improvement in linearity resulting from this embodiment.

Figure 9:
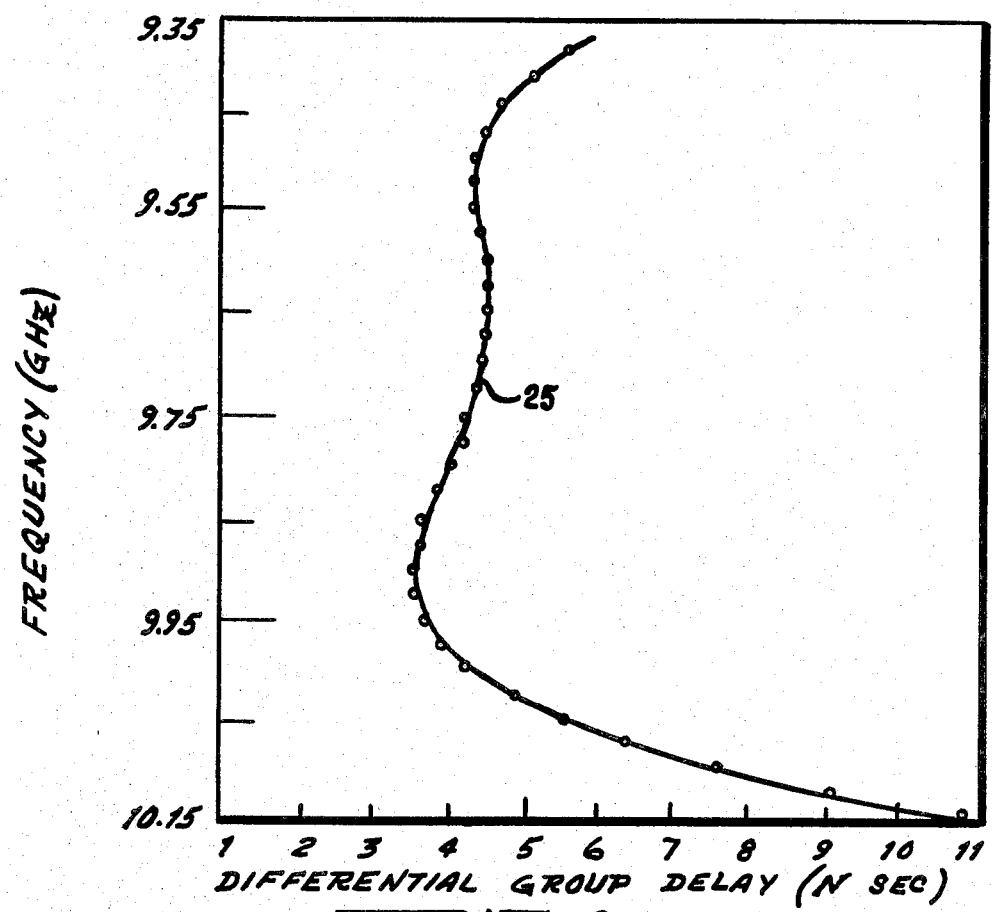
FIG. 9 is a graph showing the improvement in delay linearity resulting from implementation of the embodiment of FIG. 6.

The third embodiment of the invention which comprehends tapering of the substrate 10 is shown in FIG. 6. In the arrangement shown the magnetic bias field is again a uniform 3000 gauss as indicated by the graph above FIG. 6 and the distance D between substrate 10 and ground plane member 11 is uniform and $d_1=d_2=20$ microns. In this embodiment substrate 10 is uniformly tapered such that $t_1=10$ microns and $t_2=30$ microns. Curve 25 of FIG. 9 shows the improvement in linearity achieved by utilizing this embodiment.

It is also recognized that the delay linearity may be optimized and/or the frequency range of delay linearity may be maximized by other functional variations in any one or all of the parameters given. The linearity improvement is not limited exclusively to forward volume waves and may include backward volume waves and surface waves.

While the invention has been described in presently preferred embodiments it is understood that the words which have been used are words of description rather than words of limitation and that changes within the purview of the appended claims may be made without departing from the scope and spirit of the invention in its broader aspects.

What is claimed is:

1. In a magnetostatic wave delay line having a ground plane member, a magnetostatic substrate member in spaced proximate relationship thereto, transmitting and receiving transducers spaced apart and operably engaged to said substrate member and means for generating a magnetic bias field, the improvement residing in a delay line parameters configuration of discrete parameters for group delay linearity enhancement, said delay line parameters configuration comprising linear parameter variation with distance, between said transmitting and receiving transducers, said linear parameter variation being implemented by means of a linear variation of the magnetic field bias strength.

2. A magnetostatic wave delay line as defined in claim 1 wherein the linear parameter variation is implemented by means of a linear variation of the magnetostatic substrate thickness.

3. A magnetostatic wave delay line as defined in claim 1 wherein the linear parameter variation is implemented by means of a linear variation of magnetostatic substrate member to ground plane member spatial relationship.

4. A magnetostatic wave delay line as defined in claim 1 wherein said magnetic field bias strength varies from a field strength of 3000 gauss at one transducer to 3200 gauss at the other transducer.

5. A magnetostatic wave delay line is defined in claim 2 wherein the thickness of said magnetic substrate varies from 10 microns at one transducer to 30 microns at the other transducer.

6. A magnetostatic wave delay line as defined in claim 3 wherein magnetostatic substrate member to ground plane member spatial relationship varies from 10 microns at one transducer to 30 microns at the other transducer.

7. A magnetostatic wave delay line as defined in claim 1 wherein said magnetostatic substrate member is comprised of a magnetic crystal garnet film.

8. A magnetostatic wave delay line as defined in claim 7 wherein said manetic crystal garnet film is Yittmium Iron Garnet.

* * * * *